(12) United States Patent
Klaba et al.

(10) Patent No.: US 11,089,720 B2
(45) Date of Patent: Aug. 10, 2021

(54) HEAT EXTRACTION SYSTEM FOR A COMPUTING EQUIPMENT ENCLOSURE

(71) Applicant: OVH, Roubaix (FR)

(72) Inventors: Henryk Klaba, Roubaix (FR); Ali Chehade, Templeuve (FR)

(73) Assignee: OVH, Roubaix (FR)

( * ) Notice: Subject to any disclaimer, the term of this patent is extended or adjusted under 35 U.S.C. 154(b) by 0 days.

(21) Appl. No.: 16/793,571

(22) Filed: Feb. 18, 2020

(65) Prior Publication Data

US 2020/0281099 A1 Sep. 3, 2020

(30) Foreign Application Priority Data

Feb. 28, 2019 (EP) .................................. 19315014.1

(51) Int. Cl.
*H05K 7/20* (2006.01)
*F28D 15/02* (2006.01)

(52) U.S. Cl.
CPC ..... *H05K 7/20836* (2013.01); *F28D 15/0275* (2013.01); *H05K 7/20172* (2013.01);
(Continued)

(58) Field of Classification Search
CPC ........... H05K 7/20836; H05K 7/20172; H05K 7/20209; H05K 7/20309; H05K 7/20318;
(Continued)

(56) References Cited

U.S. PATENT DOCUMENTS

| 5,579,830 A | 12/1996 | Giammaruti |
| 10,806,056 B2 * | 10/2020 | Cuda .................. H05K 7/20781 |

(Continued)

FOREIGN PATENT DOCUMENTS

| CN | 2856809 Y | 1/2007 |
| CN | 102355807 A | 2/2012 |

(Continued)

OTHER PUBLICATIONS

European Search Report with regard to the counterpart EP Patent Application No. 19315014.1 completed Aug. 1, 2019.
(Continued)

*Primary Examiner* — Ronald D Hartman, Jr.
(74) *Attorney, Agent, or Firm* — BCF LLP

(57) ABSTRACT

A heat extraction system for an enclosure comprises heat pipes having an evaporating reference temperature and a condensing reference temperature lower than the evaporating reference temperature, an evaporator portion and a condenser portion. The heat extraction system includes a support frame adapted for connection to the enclosure. The support frame is arranged with respect to the heat pipes such that, when the support frame is connected to the enclosure, the evaporator portion is thermally coupled to the at least one computer and the condenser portion is thermally coupled to a surrounding environment of the enclosure. The heat pipes are arranged with respect to the enclosure so as to transfer thermal energy from the enclosure to the surrounding environment when an interior temperature of the enclosure is greater than the evaporating reference temperature and an exterior temperature of the surrounding environment is less than the condensing reference temperature.

17 Claims, 6 Drawing Sheets

(52) U.S. Cl.
CPC ..... *H05K 7/20209* (2013.01); *H05K 7/20309* (2013.01); *H05K 7/20318* (2013.01); *H05K 7/20336* (2013.01); *H05K 7/20745* (2013.01); *H05K 7/20827* (2013.01)

(58) Field of Classification Search
CPC .......... H05K 7/20336; H05K 7/20745; H05K 7/20827
See application file for complete search history.

(56) References Cited

U.S. PATENT DOCUMENTS

| | | | | |
|---|---|---|---|---|
| 2003/0094266 | A1 | 5/2003 | Fritsch | |
| 2011/0247348 | A1* | 10/2011 | Mashiko | H05K 7/2079 62/62 |
| 2013/0077232 | A1* | 3/2013 | Nordin | H05K 7/20809 361/679.47 |
| 2013/0153200 | A1* | 6/2013 | Rembach | F28D 15/0275 165/287 |
| 2013/0314873 | A1* | 11/2013 | Shibata | H05K 7/20827 361/696 |
| 2015/0034270 | A1* | 2/2015 | Kim | F28D 15/0266 165/11.1 |
| 2015/0056908 | A1* | 2/2015 | Chapel | H05K 7/023 454/184 |
| 2016/0338230 | A1* | 11/2016 | Kaplan | H05K 7/20809 |
| 2017/0112017 | A1 | 4/2017 | Wang | |
| 2018/0080685 | A1* | 3/2018 | Schon | H02S 40/44 |
| 2020/0163247 | A1* | 5/2020 | Ding | H05K 7/20827 |

FOREIGN PATENT DOCUMENTS

| | | |
|---|---|---|
| CN | 102538535 A | 7/2012 |
| CN | 202452867 U | 9/2012 |
| JP | 2016061483 A | 4/2016 |
| WO | 2018012428 A1 | 1/2018 |

OTHER PUBLICATIONS

Kosoy, "Heat Pipes", XP-002546842, Kirk-Othmer Encyclopedia of Chemical Technology, vol. 13, 2004, pp. 225-241; received from EPO on Aug. 9, 2019.

Lips et al., "Overview of heat pipe studies during the period 2010-2015". Interfacial Phenomena and Heat Transfer, 4(1), 2016, 28 pages.

Chen et al., "A review of small heat pipes for electronics", Applied Thermal Engineering, 96, 2016, 43 pages.

Jouhara et al., "Heat pipe based systems—Advances and applications", Energy, 128, 2017, pp. 729-754.

Burlacu et al., "Energy efficient heat pipe heat exchanger for waste heat recovery in buildings", Procedia Manufacturing, 22, 2018, pp. 714-721.

Okazaki et al., "Meter-Scale Multi-Loop Capillary Heat Pipe", Applied Thermal Engineering, 141, 2018, pp. 20-28.

English Translation of WO2018012428—Machine Translated by the EPO; received on Aug. 9, 2019.

English Translation of CN202452867—Machine Translated by the EPO; received on Aug. 9, 2019.

English Translation of CN102538535—Machine Translated by the EPO; received on Aug. 9, 2019.

English Translation of CN102355807—Machine Translated by the EPO; received on Aug. 9, 2019.

English Translation of CN2856809—Machine Translated by the EPO; received on Aug. 9, 2019.

English Translation of JP2016061483—Machine Translated by the EPO; received on Aug. 9, 2019.

"Schematic view of a circular tube bank plate fin heat exchanger (first model)", https://www.researchgate.net/figure/Schematic-view-of-a-circular-tube-bank-plate-fin-heat-exchanger-first-model_fig1_233062290, accessed Feb. 18, 2019, pdf 8 pages.

* cited by examiner

HEAT EXTRACTION SYSTEM FOR A COMPUTING EQUIPMENT ENCLOSURE

CROSS-REFERENCE

The present application claims priority from European Patent Application no. 19315014.1, filed on Feb. 28, 2019, the disclosure of which is incorporated by reference herein.

FIELD

The present technology relates to heat extraction systems for computing equipment enclosures.

BACKGROUND

Operation of information technology (IT) infrastructure on an industrial scale is known to be demanding in terms of energy consumption. Among such infrastructure, data centers are known to lack efficiency in their power consumption. A corollary to the power usage inefficiency issue is that a material proportion of the power delivered to computing equipment of the data center is spent generating heat emanating from the computing equipment as it is in operation. Further, the computing equipment needs to operate in a definite range of operating temperatures in order to attain the desired levels of performance in terms of workload capacity and uptime. For this reason, known data centers typically rely on cooling systems adapted to remove heat from the vicinity of the computing equipment so as to maintain the operating temperature within the acceptable range. However, known heat extraction systems conventionally used in data centers are subject to installation, operation and maintenance requirements to which resources are allocated at the expense of computing capacity. For instance, some such known conventional heat extraction systems rely on closed-circuit conduits to circulate a heat transfer fluid between the computing equipment and colder environments. Understandably, such systems take up space adjacent the computing equipment and also draw additional power to circulate and cool the fluid, reducing by as much any available space and power that might have otherwise been allocated to additional computing equipment. Furthermore, such systems necessitate time-consuming installation and monitoring activities to mitigate risks of damages to the computing equipment occurring as a result of fluid leakage, this being an ubiquitous source of concern of the IT industry.

Therefore, it is believed that a heat extraction system that may palliate at least some of the above drawbacks is desired.

SUMMARY

It is an object of the present technology to ameliorate at least some of the inconveniences present in the prior art.

It is also an object of the present technology to provide an improved heat extraction system at least as compared with some of the prior art systems.

According to one aspect of the present technology, there is provided a heat extraction system for an enclosure receiving at least one computer. The heat extraction system comprises at least one heat pipe having an evaporating reference temperature and a condensing reference temperature lower than the evaporating reference temperature, an evaporator portion and a condenser portion. The heat extraction system further includes a support frame adapted for connection to the enclosure, the support frame being arranged with respect to the at least one heat pipe, such that, when the support frame is connected to the enclosure, the evaporator portion is thermally coupled to the at least one computer via convection and the condenser portion is thermally coupled to a surrounding environment of the enclosure via convection. The at least one heat pipe is arranged with respect to the enclosure so as to transfer thermal energy from the enclosure to the surrounding environment when an interior temperature of the enclosure is greater than the evaporating reference temperature, and an exterior temperature of the surrounding environment is less than the condensing reference temperature.

In some embodiments of the present technology, the heat extraction system further comprises a control unit adapted for receiving a signal indicative of the exterior temperature of the surrounding environment and an external fan electronically connected to the control unit and disposed proximate the condenser portion. The control unit causes the external fan to direct an external air flow toward the condenser portion when the exterior temperature of the surrounding environment is less than the condensing reference temperature and to direct the external air flow away from the condenser portion when the exterior temperature of the surrounding environment is less than the condensing reference temperature.

In some embodiments of the present technology, the heat extraction system further comprises a control unit adapted for receiving a signal indicative of the exterior temperature of the surrounding environment, and an evaporative cooling system disposed proximate the condenser portion and electronically connected to the control unit. The control unit selectively causes the evaporative cooling system to cool the condenser portion when the exterior temperature of the surrounding environment reaches or exceeds a secondary cooling triggering temperature.

In some embodiments of the present technology, the evaporative cooling system includes an external fan. The control unit causes the external fan to accelerate the velocity of air surrounding the condenser portion to cool the condenser portion.

In some embodiments of the present technology, the evaporative cooling system includes a sprayer. The control unit causes the sprayer to humidify air surrounding the condenser portion to cool the condenser portion.

In some embodiments of the present technology, the heat extraction system further comprises a control unit adapted for receiving a signal indicative of the exterior temperature of the surrounding environment and a dry cooling system disposed proximate the condenser portion and electronically connected to the control unit. The control unit selectively causes the dry cooling system to cool the condenser portion when the exterior temperature of the surrounding environment reaches or exceeds a secondary cooling triggering temperature.

In some embodiments of the present technology, the heat extraction system further comprises a control unit adapted for receiving a signal indicative of the interior temperature of the enclosure, and an internal fan disposed proximate the evaporator portion and electronically connected to the control unit. The control unit selectively causes the internal fan to direct an internal air flow toward the evaporator portion when the interior temperature of the enclosure reaches or exceeds an internal fan triggering temperature.

In some embodiments of the present technology, the internal fan is arranged with respect to the at least one computer to aspire a heated air flow away from the at least one computer.

In some embodiments of the present technology, the at least one computer has a computer fan, and at least a portion of the heated air flow aspired by the internal fan is directed away from the at least one computer by the computer fan.

In some embodiments of the present technology, the control unit is adapted to be electronically connected to the computer fan for selectively directing the at least a portion of the heated air flow away from the at least one computer.

In some embodiments of the present technology, the support frame is adapted for connection to the enclosure via an opening of the enclosure, and the support frame is arranged with respect to the opening so as to fluidly seal the enclosure from the surrounding environment when the support frame is connected to the enclosure.

In some embodiments of the present technology, the heat extraction system further comprises a control unit, an internal fan disposed proximate the evaporator portion and electronically connected to the control unit, and an external fan electronically connected to the control unit and disposed proximate the condenser portion. The evaporator portion is thermally coupled to the at least one computer via convection. The condenser portion is thermally coupled to a surrounding environment of the enclosure via convection. The at least one heat pipe, the internal fan and the external fan are sized with respect to the at least one computer so as to fit inside a perimeter of the at least one computer. The at least one heat pipe is arranged with respect to the enclosure so as to transfer thermal energy from the enclosure to the surrounding environment when an interior temperature of the enclosure is greater than the evaporating reference temperature and an exterior temperature of the surrounding environment is less than the condensing reference temperature.

In some embodiments of the present technology, the at least one heat pipe is adapted for transferring thermal energy from inside of the enclosure to the surrounding environment at least at a target heat extraction rate when the control unit causes the internal fan to direct an internal air flow toward the evaporator portion and the control unit causes the external fan to direct an external air flow toward the condenser portion. The at least one heat pipe transfers thermal energy at a rate being less than the target heat extraction rate in absence of at least one of the internal air flow and the external air flow.

In some embodiments of the present technology, the at least one heat pipe is a loop heat pipe.

According to another aspect of the present technology, there is provided a data center comprising the heat extraction system and the enclosure of any one of the above-mentioned embodiments.

While most embodiments of the present technology are intended for use with modular, de-centralized data centers, some embodiments of the present technology may be adapted for use with other types of infrastructure such as whole-building, centralized data centers. Also, while most embodiments of the present technology are intended for use as a primary heat extraction system, some embodiments of the present technology may be adapted for use as an auxiliary heat extraction system.

In the context of the present specification, unless expressly provided otherwise, a computer system may refer, but is not limited to, an "electronic device", an "operation system", a "system", a "computer-based system", a "computing equipment", a "computer", a "controller unit", a "control unit", a "monitoring device", a "control device" and/or any combination thereof appropriate to the relevant task at hand.

In the context of the present specification, unless expressly provided otherwise, the words "first", "second", "third", etc. have been used as adjectives only for the purpose of allowing for distinction between the nouns that they modify from one another, and not for the purpose of describing any particular relationship between those nouns.

Implementations of the present technology each have at least one of the above-mentioned object and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of implementations of the present technology will become apparent from the following description, the accompanying drawings and the appended claims.

BRIEF DESCRIPTION OF THE DRAWINGS

For a better understanding of the present technology, as well as other aspects and further features thereof, reference is made to the following description which is to be used in conjunction with the accompanying drawings, where.

DETAILED DESCRIPTION

The examples and conditional language recited herein are principally intended to aid the reader in understanding the principles of the present technology and not to limit its scope to such specifically recited examples and conditions. It will be appreciated that those skilled in the art may devise various arrangements which, although not explicitly described or shown herein, nonetheless embody the principles of the present technology and are included within its spirit and scope.

Furthermore, as an aid to understanding, the following description may describe relatively simplified implementations of the present technology. As persons skilled in the art would understand, various implementations of the present technology may be of a greater complexity.

In some cases, what are believed to be helpful examples of modifications to the present technology may also be set forth. This is done merely as an aid to understanding, and, again, not to define the scope or set forth the bounds of the present technology. These modifications are not an exhaustive list, and a person skilled in the art may make other modifications while nonetheless remaining within the scope of the present technology. Further, where no examples of modifications have been set forth, it should not be interpreted that no modifications are possible and/or that what is described is the sole manner of implementing that element of the present technology.

Moreover, all statements herein reciting principles, aspects, and implementations of the present technology, as well as specific examples thereof, are intended to encompass both structural and functional equivalents thereof, whether they are currently known or developed in the future. Thus, for example, it will be appreciated by those skilled in the art that any schematic representations herein depict conceptual, approximate views of principles of the present technology.

With these fundamentals in place, we will now consider some non-limiting examples to illustrate various implementations of aspects of the present technology.

Figure 1:
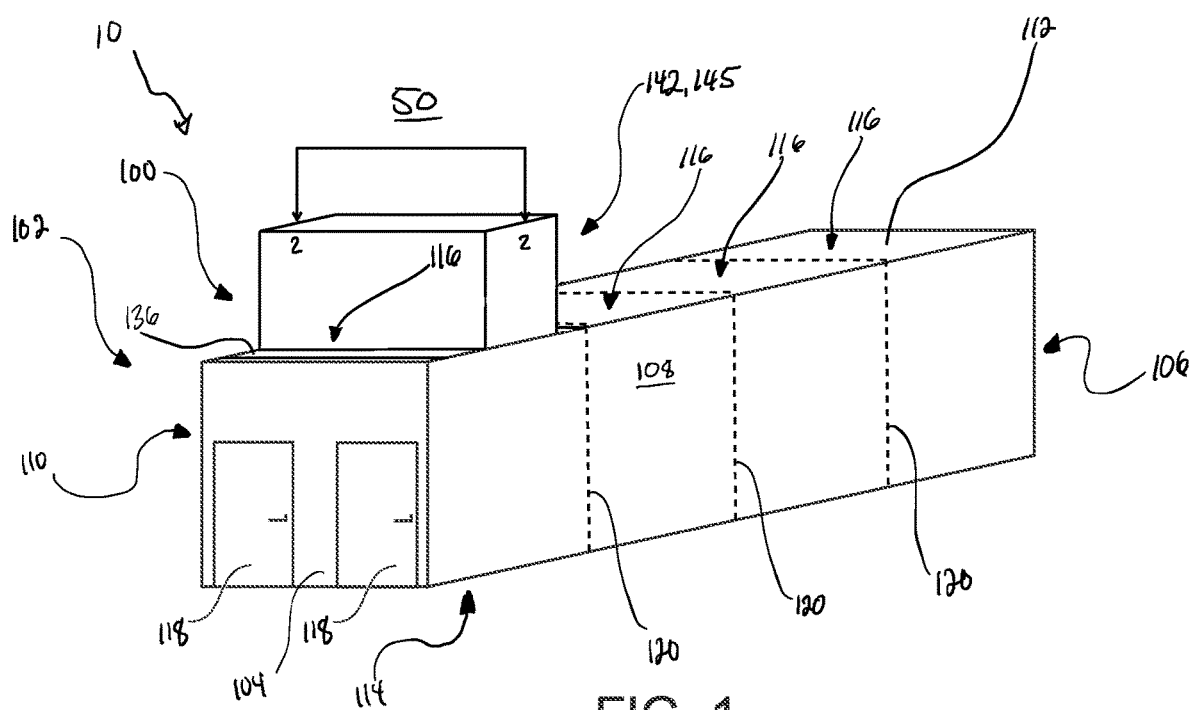
FIG. 1 is a front, top, left side perspective view of an enclosure for a data center, shown with a heat extraction system according to embodiments of the present technology.

Referring to FIG. 1, there is shown a schematic representation of a data center 10 equipped with a heat extraction system 100 according to a first embodiment of the present technology.

Figure 2:
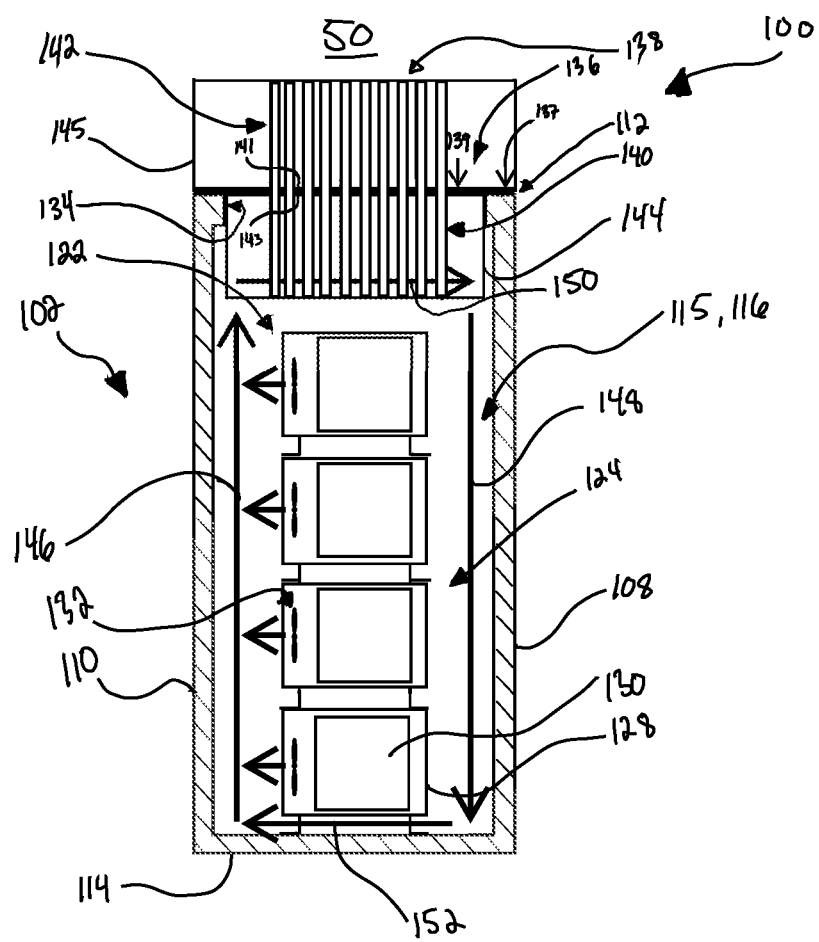
FIG. 2 is a cross-section of the enclosure of FIG. 1 taken along section line 2-2 of FIG. 1, showing a first heat extraction system of FIG. 1 according to a first embodiment of the present technology.

Referring to FIGS. 1 and 2, the data center 10 includes an enclosure 102 adapted for housing computing equipment (e.g., computers, servers, racks, computer fans, etc., generally referred to as computers 130), as will be further described hereinbelow. The enclosure 102 extends longitudinally from a front wall 104 at its front end to a rear wall 106 at its rear end. Further, the enclosure 102 has elongated left 108, right 110 walls, ceiling 112 and floor 114 disposed between the front 104 and rear 106 walls. The walls 104, 106, 108, 110, the ceiling 112 and the floor 114 together define an enclosed space 115. The enclosed space 115 is longitudinally partitioned into four chambers 116. Each one of the chambers 116 is sized for receiving computers 130 disposed in a stacked arrangement (FIG. 2). An opening 134 is defined in the top wall 112 of the enclosure 102, upward of a forward most one of the chambers 116. It is contemplated that the opening 134 may be formed by a portion of the enclosure 102 having been cut out or otherwise detached therefrom. A stack 122 of computers 130 is disposed below the opening 134. The heat extraction system 100 is disposed onto the enclosure 102 above the stack 122. The stack 122 is disposed substantially equidistantly from the left and right walls 108, 110, forming a line. Aisles are formed between the stack 122 and each of the left and right walls 108, 110, respectively. Further, the enclosure 102 is fitted with access doors 118 on its front wall 104 so as to allow access to the stacks 122 via the aisles. Inner walls 120 may be disposed between any two adjacent chambers 116 so as to isolate their respective stacks 122 from one another. It is contemplated that the enclosure could be fitted with access doors 118 on any of its walls 104, 106, 108, 110, 122 such that each stack 122 is accessible for installation or maintenance purposes. The enclosure 102 is rigged with a power supply interface (not shown) receiving power from the electric power grid and delivering the power to the computers 130 via hardwired connections (not shown). Conventionally, the computers 130 may be interconnected. Henceforth, for clarity, only forward most ones of the chambers 116, stacks 122 and heat extraction systems 100 will be shown and described.

In some embodiments, the enclosure 102 may include one of a single inner wall 120 defining two chambers 116, a pair of inner walls 120 defining three chambers 116 and more than three inner walls 120 defining more than four chambers 116. In some other embodiments, the enclosed space 115 is integral and the inner walls 120 are omitted.

It should be noted that the enclosure 102 is adapted so as to facilitate the scaling of a modular data center. In such modular data centers, the enclosure 102 may be grouped with at least one additional enclosure 102, their respective computers 130 being interconnected so as to scale computing capacity relative to demand. In such enclosure 102 configurations, the enclosure 102 and the at least one additional enclosure 102 may be disposed adjacent one another, forming a line. In other enclosure 102 configurations, the enclosure 102 and the at least one additional enclosure 102 may be disposed in a staggered manner. In yet other enclosure 102 configurations, the enclosure 102 and at least two additional enclosures 102 may be disposed with respect to one another so as to define a perimeter.

In some embodiments, stacks of computing equipment are absent from at least one empty chamber 116 of the enclosure 102. It is contemplated that when the enclosure 102 is configured for use in a modular data center, the at least one empty chamber 116 of the enclosure 102 may facilitate access to computing equipment located inside nearby enclosures 102 of the modular data center.

Figure 3:
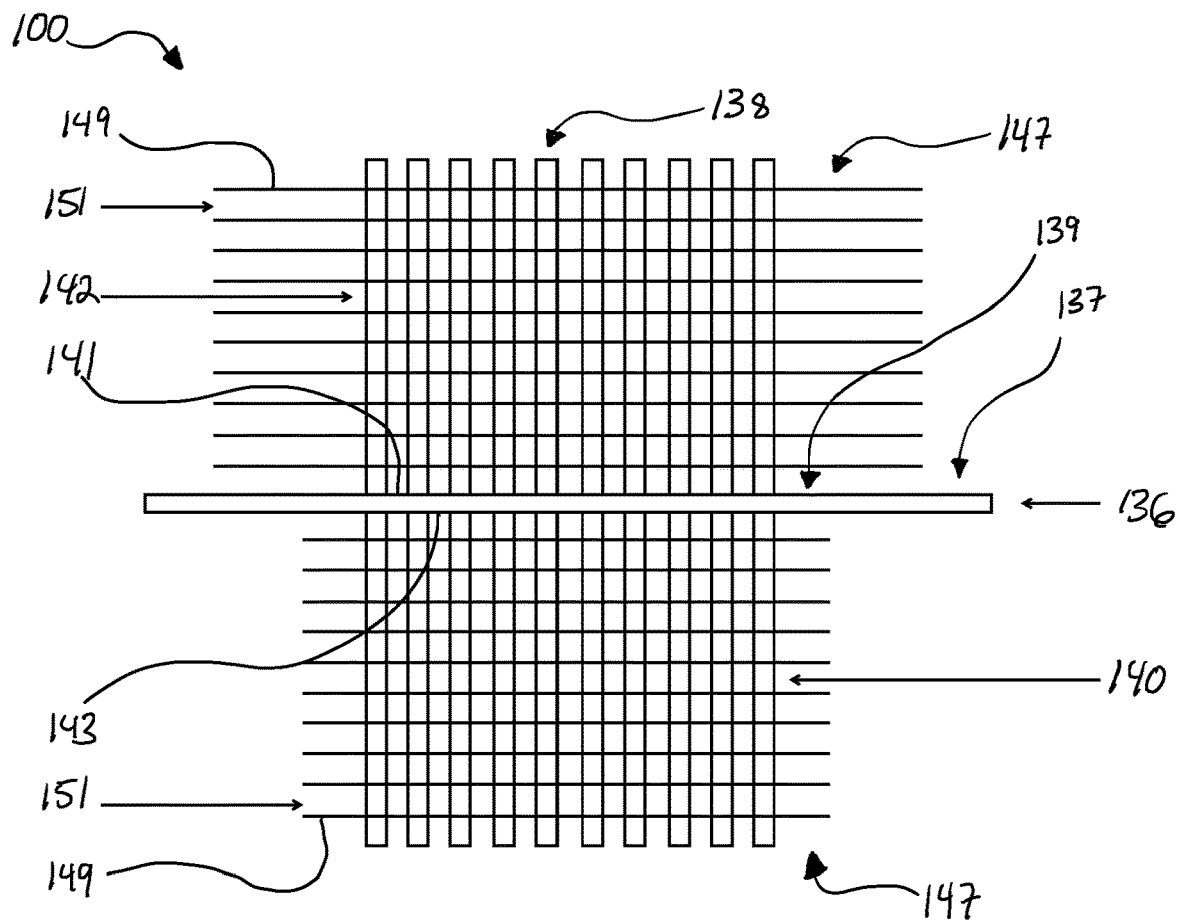
FIG. 3 is a front side elevation view of portions of the first heat extraction system of FIG. 2.
Figure 4:
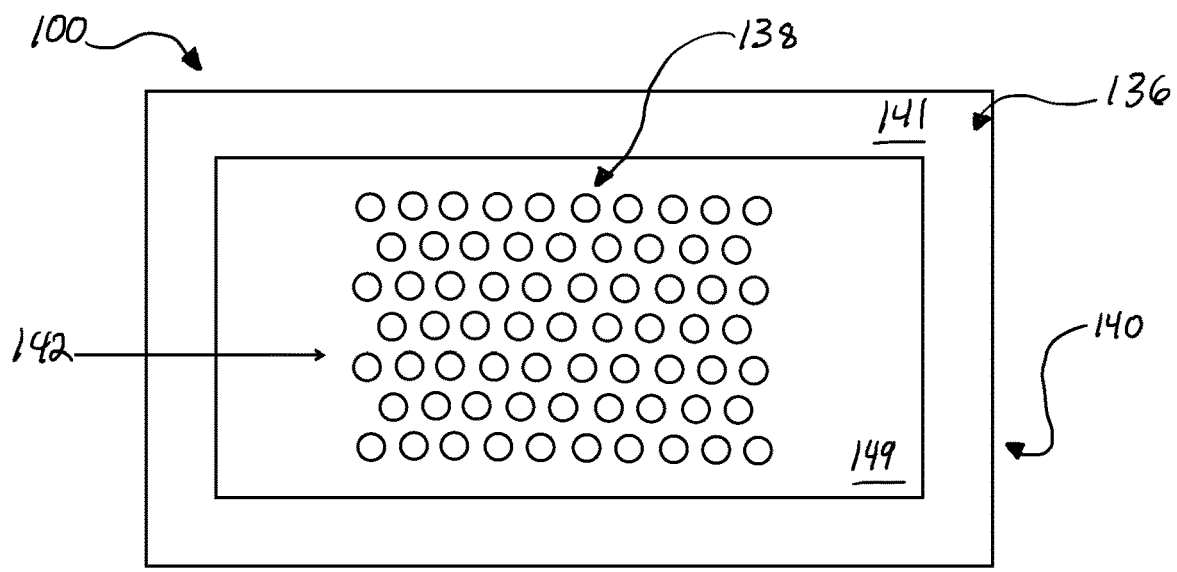
FIG. 4 is a top plan view of the portions of FIG. 3.

With respect to FIGS. 2 to 4, internal elements of the enclosure 102 and of the heat extraction system 100 will now be described. In FIG. 2, the stack 122 is shown disposed in the chamber 116. The stack 122 includes four computer modules 124 stacked on top of one another. Each computer module 124 includes a support structure 126, a housing 128 (i.e., a rack) connected to the support structure 126, a computer 130 disposed inside the housing 128 and a computer fan 132. It is contemplated that the stack 122 could include a different amount of computer modules 124 (e.g., three computer modules 124 stacked on top of one another) and could be arranged otherwise (e.g., a computer module including more than one computer and/or more than one computer fan). In this embodiment, the computers 130 of any given stack 122 together may generate heat at a rate of about 20 kW when they are being operated. The fans 132 are arranged with respect to the housings 128 and the computers 130 so as to direct a flow of air from the computers 130 to laterally outward of the stack 122 toward an aisle, in this case being the left aisle of the chamber 116.

The heat extraction system 100 includes a support frame 136 as well as heat pipes 138. The support frame 136 is adapted for connection to the enclosure 102. The support frame 136 has a broad planar and relatively thin shape, defining a core portion 139 surrounded by a peripheral portion 137. The core portion 139 defines bores (not shown) extending from a top surface 141 of the support frame 136 to a bottom surface 143 of the support frame 136. The heat pipes 138 extend through the bores to above the top surface 141 and below the bottom surface 143. The heat pipes 138 are attached to the support frame 136 via welding, holding the heat pipes 138 in place. It is contemplated that the heat pipes 138 could be attached to the support frame 136 via other means such as via an adhesive or via friction resulting from an interference fit arranged between the heat pipes 138 and the material of the support frame 136 surrounding the bores. It should be noted that the heat pipes 138 are supported indirectly by the enclosure 102 via the support frame 136. The support frame 136 is structured with respect to the heat pipes 138 and the enclosure 102 for bearing the weight of the heat pipes 138.

The peripheral portion 137 of the support frame 136 is resting onto a portion of the top wall 112 surrounding the opening 134. The heat pipes 138 extend from the support frame 136 into the chamber 116. Although absent from the Figures, a welding seam at the interface between the support frame 136 and the top wall 112 forms a seal so as to prevent fluids (e.g., water pooling on top of the enclosure 102 as a result of condensation or rain) from entering the chamber 116 via the opening 134. Under certain circumstances, such as when the heat pipes 138 are supported from underneath, the peripheral portion 137 of the support frame 136 may overhang the top wall 112 of the enclosure 102, defining a gap therebetween. Gaps may also be defined due to a lack of complementarity between the top wall 122 and the support frame 136. Conveniently, the seal may also be formed by at least one of a gasket and caulk (not shown), filling the gaps at the interface between the support frame 136 and the top wall 112. As such, it should be noted that the present technology was developed with ease of installation in mind.

Each one heat pipe of the heat pipes 138 comprises an elongated, hollow-bodied and thermally conductive structure adapted for transferring heat from a high-temperature (i.e. evaporator) portion to a low-temperature (i.e., condenser) portion when the high-temperature portion is hotter than an evaporating reference temperature and the low-temperature portion is colder than a condensing reference temperature, the condensing reference temperature being lower than the evaporating reference temperature. The general operating principles of the heat pipes 138 will now be described. A working fluid having a given evaporating reference temperature and a corresponding condensing reference temperature is sealed into a cavity extending inside the one heat pipe. The heat pipe is sized and structured with respect to thermodynamic properties of the working fluid such that a desired heat transfer rate may occur between its high and low-temperature portions. Heat transfer occurs between the high-temperature and low-temperature portions when respectively heated up to the evaporating reference temperature of the working fluid, or higher, and cooled down to the condensing reference temperature of the working fluid, or lower. At the high-temperature portion, the working fluid is vaporized as it absorbs heat from a proximate heat source. The vaporized working fluid is then transported by convection along a conduit extending within the cavity toward the low-temperature portion. The vaporized working fluid then condenses back into liquid form as the heat dissipates away from the working fluid into a proximate, relatively colder environment. As it condenses, the working fluid then migrates back to the high-temperature portion via space surrounding the conduit inside the cavity, thereby completing a heat extraction cycle. Vertical orientation of the heat pipe assists convection of the working fluid, as natural convection assisting the vaporizing working fluid to migrate toward the low-temperature portion, and gravitational convection assisting the condensing working fluid to migrate toward the high-temperature portion. Still, orientations other than vertical are possible. As the general operating principles of heat pipes 138 are known, those will not be further described.

In consistency with the aforementioned general operating principles, the heat extraction system 100 has an evaporator portion 140 and a condenser portion 142. The evaporator portion 140 contains high-temperature portions of the heat pipes 138 extending under the bottom surface 143 of the support frame 136. Similarly, the condenser portion 142 contains low-temperature portions of the heat pipes 138 extending from the top surface 141 of the support frame 136. In an embodiment, the condenser portion 142 may extend within the housing 128. The support frame 136 is arranged with respect to the heat pipes 138 such that when the support frame 136 is connected to the enclosure 102 (as best seen in FIG. 2), the evaporator and condenser portions 140 and 142 are thermally coupled via convection to the stack 122 of computing equipment and to a surrounding environment 50 of the enclosure 102, respectively. In this configuration, the heat pipes 138 extend from the chamber 116 to the surrounding environment 50 of the enclosure 102.

A bottom vented hood 144 and a top vented hood 145 (not shown in detail) are disposed around the evaporator 140 and condenser 142 portions of the heat pipes 138, respectively. It should be noted that each of the bottom and top vented hoods 144 and 145 allows air to be flowed therethrough so as to assist in transferring heat between the evaporator 140 and condenser 142 portions and their respective surrounding air. In the present embodiment, the bottom and top vented hoods 144 and 145 include heat exchangers 147. Shown in FIG. 3, the heat exchangers 147 are otherwise not depicted in the Figures for clarity. The heat exchangers 147 are disposed on each side of the support plate 136 so as to surround the high and low-temperature portions of the heat pipes 138. The heat exchangers 147 have fins 149 extending laterally outward from the heat pipes 138. The fins 149 are spaced from one another, defining vents 151. The fins 149 are crimped to the heat pipes 138, holding them in place. It is contemplated that the fins 149 could be joined to the heat pipes 138 via different means, such as welding. Alternate types of top and bottom vented hoods are contemplated. It is contemplated that in some embodiments, the bottom and top vented hoods could be omitted so as to render the evaporator portion 140 directly exposed with respect to the chamber 116 and the condenser portion 142 directly exposed with respect to the surrounding environment 50, respectively.

The computing equipment of the stack 122 is expected to generate heat (i.e. thermal energy) at a normal input rate. The heat pipes 138 are provided in a sufficient number and are arranged with respect to the enclosure 102 and the stack 122 so as to cause the heat to be transferred from the enclosure 102 to the surrounding environment 50 at a target output rate (i.e., heat extraction rate). The target output rate is attainable when the support frame 136 is in the operative configuration, the evaporator portion 140 is exposed to an interior temperature of the enclosure 102 that exceeds the evaporating reference temperature and the condenser portion 142 is exposed to an exterior temperature of the surrounding environment below the condensing reference temperature, with a margin added to these temperature differences. Under such conditions, as will be described in further detail, convection occurring inside the chamber may direct the heat toward the evaporator portion 140, and convection occurring in the surrounding environment 50 may direct the heat away from the condenser portion 142, allowing the transfer to take place.

Under normal operating conditions, a heated air flow 146 consisting substantially of air having been heated by the computers 130 moves upwardly toward the evaporator portion 140. The heated air flow 146 moves upwardly along a side of the stack 122 toward which the computer fans 132 move the air having been heated by the computers 130. In this case, the heated air flow 146 is in the right aisle (i.e., hot aisle, shown on the left hand-side on FIG. 5) of the stack. A cooled air flow 148 having been cooled by the evaporator portion 140 moves away from the evaporator portion 140 and downwardly along an opposite side of the stack 122. In this case, the cooled air flow 148 is in the left aisle (i.e., cold aisle). A top inner air flow 150 consisting substantially of the heated air flow 146 circulates through the evaporator portion 140 from the heated air flow 146 to the cooled air flow 148. A return air flow 152 circulates through the stack 122 from the cooled air flow 148 to the heated air flow 146. The return air flow 152 is heated by the computers 130 as it circulates through the stack 122. The heated 146, top 150, cooled 148 and return 152 air flows together form an interior convection cycle. It should be noted that the computing equipment modules 124 of the stack 122 are structured and arranged to facilitate circulation of the return air flow 152 through the stack 122. Further, in this embodiment, the interior convection cycle occurs substantially naturally (i.e., passively, without mechanical assistance means other than the computer fans 130) and suffices for exposing the evaporator portion 140 to temperatures exceeding the evaporating reference temperature.

Normal operation of the computers 130 is expected when the interior temperature of the enclosure 102 is in a temperature range between 293 Kelvin (293 K, 20 degrees Celsius) and 308 K (35° C.) inclusive. It is contemplated that when the interior temperature of the enclosure 102 is between 288 K (15° C.) and 293 K (20° C.), or between 308 K (35° C.) and 313 K (40° C.), the operation of the computers 130 may remain acceptable. When the interior temperature of the enclosure 102 is either below 288 K (15° C.) or above 313 K (40° C.), the operation of the computers 130 is expected to be adversely affected.

In this embodiment, the target output rate is 20 kW, which is commensurate to the normal input rate at which heat may be released inside the chamber 116 by the computers 130 under the normal operating conditions. In other embodiments, the target output rate may be around 10 kW. In yet other embodiments, the target output rate may be around 30 kW.

The normal operating conditions also provide that the target output rate is reached when the interior temperature of the enclosure 102 exceeds the evaporating reference temperature by a desired margin, for example about 5 K, or when the exterior temperature of the surrounding environment is below the condensing reference temperature by the desired margin, or when a sum of respective margins between these interior and exterior temperatures and the evaporating and condensing reference temperatures is equivalent to the desired margin. It should be noted that given the outside ambient temperatures found in various hospitable climates, the target output rate may be attainable passively. For example, the condenser portion 142 may be exposed to an exterior temperature of the surrounding environment that is below the condensing reference temperature by more than the desired margin so that the target output rate may be reached without requiring additional cooling means. Under other circumstances where the condenser portion 142 is exposed to adversely high exterior temperatures of the surrounding environment, the target output rate may not reach the normal input rate without additional cooling means. In such cases, alternatives for cooling the condenser portion 142 or alternatives for extracting heat from the chamber 116 may be desirable, some of which will be described herein. For example, it is contemplated that under certain circumstances, at least one cooling system (e.g., a chiller) may be used to mechanically assist in extracting heat from the chamber 116. Alternatively or in addition, cooling systems may be used to cool the condenser portion 142, thereby indirectly assisting in extracting heat from the chamber 116. Louvers and lateral fans (not shown) arranged with respect to one another and disposed onto the 108 and 110 walls, respectively, are also among the means contemplated to assist in extracting heat from the chamber 116.

Figure 5:
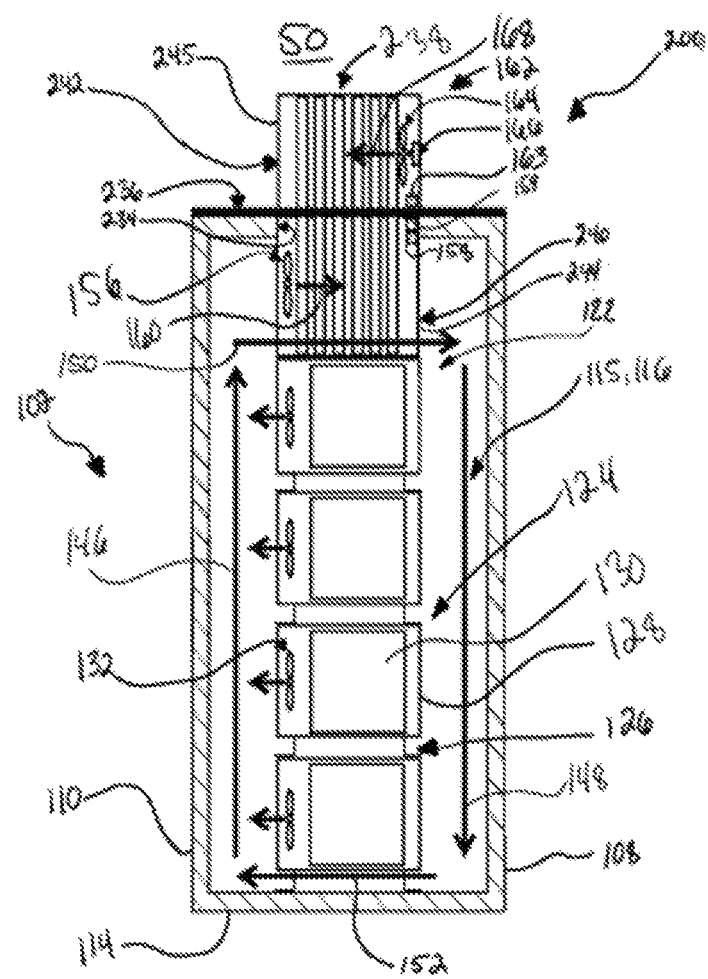
FIG. 5 is a cross-section of the enclosure of FIG. 1 taken along section line 2-2 of FIG. 1, showing a second heat extraction system according to a second embodiment of the present technology.

Turning now to FIG. 5, a heat extraction system 200 according to a second embodiment of the present technology is shown connected to the enclosure 102. A description of elements being alike those described in the previous embodiment is not repeated for brevity. The heat extraction system 200 includes heat pipes 238 attached to a support frame 236. The heat pipes 238 have an evaporator portion 240 and a condenser portion 242 disposed on each side of the support frame 236, respectively. The evaporator portion 240 is supported onto the stack 122. An internal fan 156 is disposed proximate the evaporator portion 240, inside its bottom vented hood 244. Similarly, an external fan 164 is disposed proximate the condenser portion 242, inside its top vented hood 245. The bottom vented hood 244, the heat pipes 238 and the top vented hood 245 are sized so as to fit inside a perimeter of the stack 122. It should be noted that due to the size and position of the heat extraction system 200 relative to the stack 122, the heat extraction system 200 does not encroach on the aisles. This configuration is deemed to be convenient for the installation of the heat extraction system 200.

The internal fan 156 is arranged with respect to the computing equipment in the stack 122 such that the internal fan 156 may increase the velocity of the heated air flow 146 and of the top inner air flow 150. Under certain circumstances, increasing the velocity of the heated and top inner air flows 146, 150 via the internal fan 156 is expected to cause an increase of the temperature of the evaporator portion 140, causing the rate at which thermal energy is transferred from the enclosure 102 to the surrounding environment 50 to increase. The external fan 164 is arranged with respect to the computing equipment in the stack 122 such that the external fan 164 may increase the velocity of air surrounding the condenser portion 242. Under certain circumstances, increasing the velocity of the air in contact with the condenser portion 242 is expected to cause the condenser portion 242 to cool down, increasing the rate at which thermal energy is transferred from the enclosure 102 to the surrounding environment 50.

The internal and external fans 156, 164 are electronically connected to a control unit 158. The control unit 158 is disposed onto a bottom surface 243 of the support frame 236, as shown. The control unit 158 causes the internal fan 156 to direct an internal air flow 160 toward the evaporator portion 240 and to draw the heated air flow 146 away from the stack 122, thereby mechanically assisting the internal convection cycle occurring inside the chamber 116. It should be understood that the internal air flow 160 substantially consists in the heated air flow 146 having been drawn by the internal fan 156. Further, the control unit 158 causes the external fan 164 to direct an external air flow 168 toward the condenser portion 242.

The heat pipes 238 are sized and are arranged with respect to the fans 156, 164, the enclosure 102 and the stack 122 such that, under the normal operating conditions and in presence of the internal and external air flows 160, 168, the heat pipes 238 cause the heat to be transferred from the enclosure 102 to the surrounding environment 50 at the target output rate. In absence of the internal and external air flows 160, 168, the heat pipes 238 cause the heat to be transferred from the enclosure 102 to the surrounding environment 50 at a rate that is less than the target output rate. Further, in absence of the internal and external air flows 160, 168, the fans 156, 164 may be controlled via the control unit 158 to cause the rate to increase so as to attain the target output rate.

In this embodiment, an evaporative cooling system 162 is formed by the external fan 164 and a sprayer 166 disposed proximate the condenser portion 242. The sprayer 166 is connected to a water supply (not shown) and disposed with respect to the condenser portion 142 for directing vaporized water toward the condenser portion 242. The evaporative cooling system 162 is electronically connected to the control unit 158. The control unit 158 is adapted for receiving a signal indicative of an exterior temperature of the surrounding environment 50 from an external temperature sensor 163 of the heat extraction system 200. The external temperature sensor 163 may for example be disposed onto the top surface 241 of the support frame 136, as shown. It is contemplated that the external temperature sensor 163 may be structured to be attachable for example onto the enclosure 102, and that additional external temperature sensors 163 may be provided. A remote temperature sensor is among the alternatives to the external temperature sensor 163 being contemplated. The control unit 158 causes the evaporative cooling system 162 to cool the condenser portion 140 when the exterior temperature of the surrounding environment 50 reaches or exceeds a secondary cooling triggering temperature. In this embodiment, the secondary cooling triggering temperature is 35 degrees Celsius. In some embodiments, the secondary cooling triggering temperature may be greater, for example around 38° C. At the secondary cooling triggering temperature, the control unit 158 may trigger operation of a secondary cooling system. For example, the control unit 158 may cause the external fan 164 to direct the external air flow 164 toward the condenser portion 242 and cause the sprayer 166 to vaporize water in the air surrounding the condenser portion 242, causing the temperature of the air to drop as a function of an increase in humidity of the air. Under certain circumstances, increasing the humidity of the air in contact with the condenser portion 242 is expected to cause the condenser portion 242 to cool down, increasing the rate at which thermal energy is transferred from the enclosure 102 to the surrounding environment 50.

In other embodiments, the heat pipes 238 are sized and are arranged with respect to the internal fan 156, the external fan 164, the sprayer 166, the enclosure 102 and the stack 122 such that, under the normal operating conditions and in presence of the internal and external air flows 160, 168, and in presence of vaporized water in the air surrounding the condenser portion 242, the heat pipes 238 cause the heat to be transferred from the enclosure 102 to the surrounding environment 50 at the target output rate. In absence of at least one of the internal air flow 160, the external air flow 168, and vaporized water surrounding the condenser portion 242, the heat pipes 238 cause the heat to be transferred from the enclosure 102 to the surrounding environment 50 at a rate that may be less than the target output rate. Further, in absence of at least one of the internal air flow 160, the external air flow 168, and vaporized water surrounding the condenser portion 242, at least one of the internal fan 156, the external fan 164 and the sprayer 166 may be controlled via the control unit 158 to cause the rate to increase so as to attain the target output rate.

In some embodiments, the sprayer 166 may be omitted. In some embodiments, at least a portion of the evaporative cooling system 162 may be external to the top vented hood 145. In some embodiments, instead of being controlled by the control unit 158 as described above, the evaporative cooling system 162 is either controlled locally (e.g., by one of the computers 130) or remotely (e.g., by another computer connected thereto, for example via satellite). In some such embodiments, the control unit 158 may be omitted.

In some embodiments, the control unit 158 is adapted for receiving a signal indicative of the interior temperature of the enclosure 102 from an internal temperature sensor 159 of the heat extraction system 200. The internal temperature sensor 159 may for example be disposed onto the bottom surface 243 of the support frame 136, as shown. It is contemplated that more than one internal temperature sensor 159 could be used. It is also contemplated that at least one internal temperature sensor 159 could be located elsewhere with respect to the stack 122, for example in the hot aisle or directly onto the stack 122. When the interior temperature of the enclosure reaches or exceeds an internal fan triggering temperature, the control unit 158 causes the internal fan 156 to increase the velocity of the heated and top inner air flows 146, 150. In this embodiment, the internal fan triggering temperature is 40 degrees Celsius. In some embodiments, the internal fan triggering temperature may be greater, for example around 45° C. In the same or other embodiments, at least one of the internal fan 156 and the control unit 158 is adapted to be arranged outward of the evaporator portion 240.

In the same or other embodiments, the internal fan 156 and at least one of the computer fans 132 are controllable so as to synergistically increase the velocity of the heated air flow 146. For example, the internal fan 156 and/or the computer fans 132 may be selectively turned on or off, as desired, to provide conditions whereby the temperature of the enclosure 102 controllably reaches a level corresponding to the evaporating reference temperature of the working fluid, allowing boiling of the working fluid to take place in the evaporator portion 240 and thus allowing heat to be efficiently transferred from the evaporator portion 240 to the condenser portion 242. For example and without limitation, when the computers 130 are not fully loaded and the exterior temperature of the surrounding environment is relatively low, the interior temperature of the enclosure may be lower than the evaporating reference temperature. Under these conditions, the control unit 158 may stop or reduce the speed of one or more of the computer fans 132 for predetermined time durations, in view of causing an increase of the interior temperature of the enclosure so that boiling of the working fluid is initiated in the condenser portion 242. The external fan 164 may then be started, followed by starting of the internal fan 156 and then by restarting or increasing the speed of the computer fans 132. The control 158 may use signals exchanged with the external fan 164, the internal fan 156, the computer fans 132, the external temperature sensor 163 and the internal temperature sensor 159 to control these operations.

Figure 6:
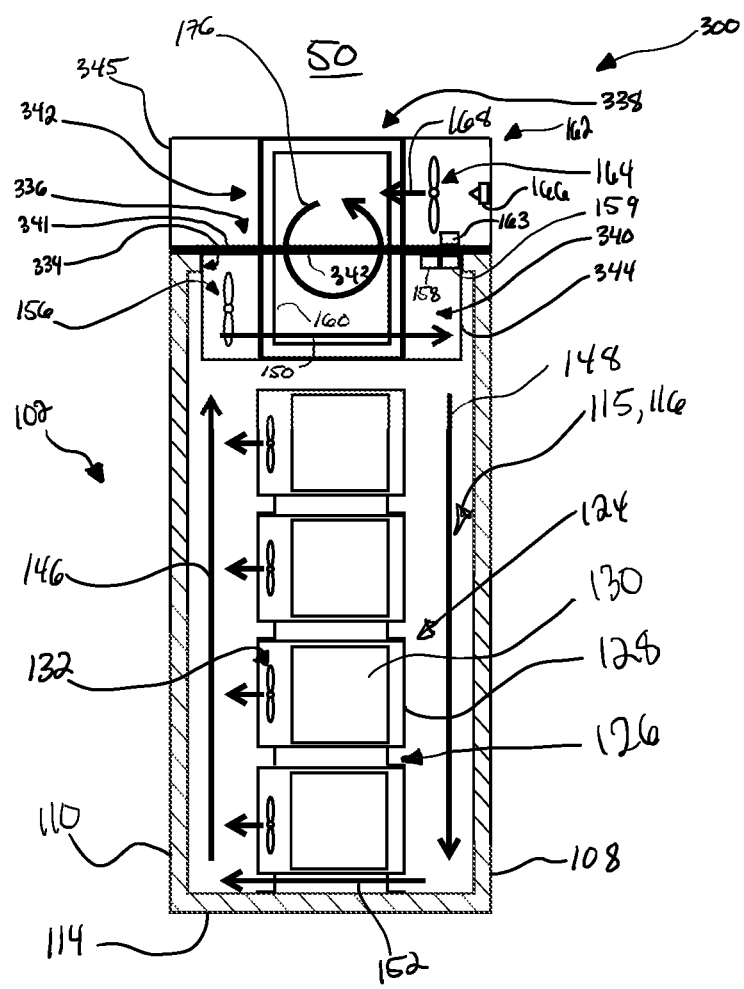
FIG. 6 is a cross-section of the enclosure of FIG. 1 taken along section line 2-2 of FIG. 1, showing a third heat extraction system according to a third embodiment of the present technology.

With reference to FIG. 6, a heat extraction system 300 according to a third embodiment of the present technology is shown. A description of elements being alike those described in the previous embodiment is not repeated for brevity. In this embodiment, the heat extraction system 300 includes a 2-phase loop heat exchanger 338 (e.g., a loop heat pipe, a thermosiphon loop or a capillary pumped loop) connected to a support frame 336. The loop heat exchanger 338 is an assembly of loop heat pipes 338 (i.e., heat pipes forming an endless loop structured for circulating a working fluid therein). In this configuration, liquid and vapor phases of the working fluid travel concurrently along the loop heat exchanger 338, forming a heat loop circulation cycle 176 having a handedness opposite that of the interior convection cycle. It should be noted that for the purposes of the present technology, general operating principles of the loop heat exchanger 338 are otherwise largely similar to those of the heat pipes 138. As such, other distinctions between the loop heat exchanger 338 and the heat pipes 138 will not be described further. Thus, the loop heat exchanger 338 of the heat extraction system 300 defines an evaporator portion 340 and a condenser portion 342. The evaporator portion 340 is defined by a high-temperature portion of the loop heat exchanger 338 extending under a bottom surface 343 the support frame 336. Similarly, the condenser portion 342 is defined by a low-temperature portion of the loop heat exchanger 338 extending above a top surface 341 of the support frame 336.

When the interior temperature of the enclosure measured by the internal temperature sensor 159 reaches or exceeds the internal fan triggering temperature, the control unit 158 causes the internal fan 156 to increase the velocity of air surrounding the evaporator portion 340, increasing the temperature of the evaporator portion 340. When the exterior temperature of the surrounding environment 50 reaches or exceeds the secondary cooling triggering temperature, the control unit 158 causes the external fan 164 to increase the velocity of air surrounding the condenser portion 342, cooling down the condenser portion 342. It should be noted that at least one of increasing the temperature of the evaporator portion 340 and reducing the temperature of the condenser portion 342 is expected to increase the velocity of the working fluid cycling inside the loop heat exchanger pipes 338. Under certain circumstances, increasing the velocity of the working fluid is expected to increase the rate at which thermal energy is transferred from the enclosure 102 to the surrounding environment 50.

Figure 7:
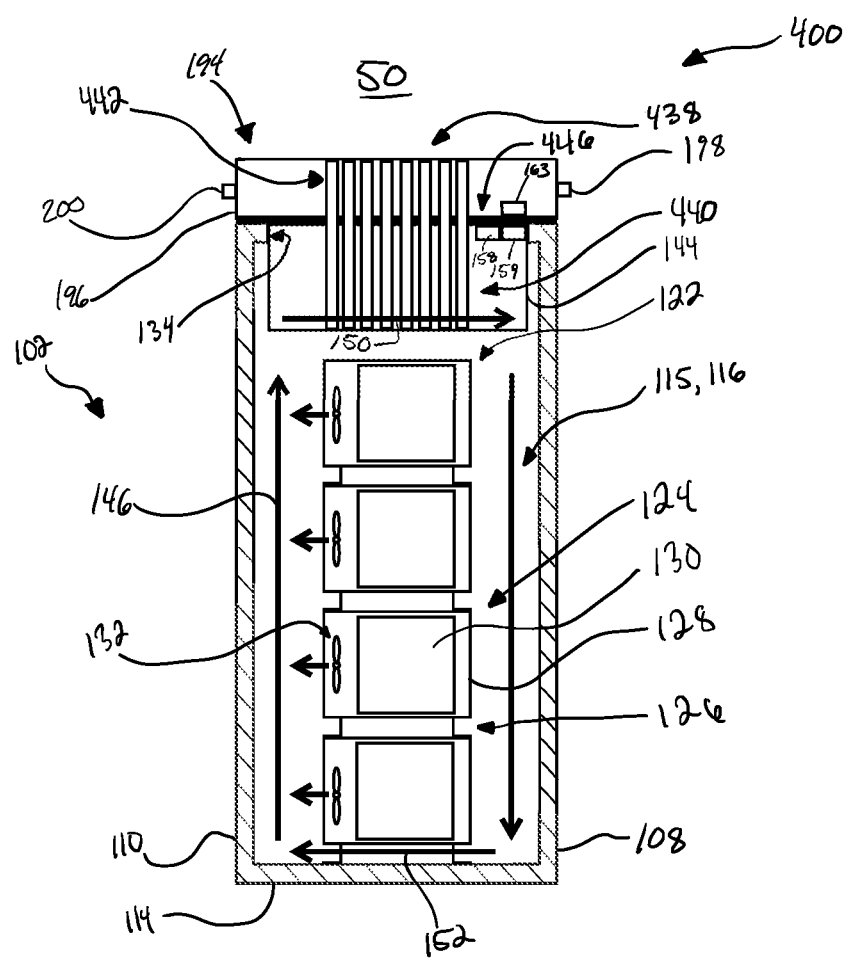
FIG. 7 is a cross-section of the enclosure of FIG. 1 taken along section line 2-2 of FIG. 1, showing a fourth heat extraction system according to a fourth embodiment of the present technology.

In FIG. 7, a heat extraction system 400 according to a fourth embodiment of the present technology is shown. A description of elements being alike those described in the previous embodiment is not repeated for brevity. In this embodiment, the heat extraction system 400 includes heat pipes 438 connected to a support frame 436. An evaporator portion 440 of the heat extraction system 400 is defined by high-temperature portions of the heat pipes 438 extending under a bottom surface 443 the support frame 436. Similarly, a condenser portion 442 of the heat extraction system 400 is defined by low-temperature portions of the heat pipes 438 extending above a top surface 441 of the support frame 436. Further, a secondary cooling system 194 of the heat extraction system 400, in this case being a dry cooling system 194, is disposed proximate the condenser portion 442 for cooling the condenser portion 442. The control unit 158 may trigger operation of the secondary cooling system 194 when the exterior temperature of the surrounding environment 50 reaches or exceeds the secondary cooling triggering temperature. Other types of secondary cooling systems, such as wet cooling towers and heat pumps, are contemplated. The condenser portion 442 extends upwardly of the chamber 116 to a reservoir 196 of the secondary cooling system 194. A cooling fluid, in this case being water, is delivered to the secondary cooling system 194 and enters the reservoir 196 via an inlet 198. Other types of cooling fluid, for example glycol, are contemplated for use in other embodiments. The cooling fluid absorbs heat released by the condenser portion 442, and exits the reservoir 196 via its outlet 200. It should be noted that cooling fluid circulating in the secondary cooling system 194 is never in contact with the working fluid inside of the heat pipes 438 of the heat extraction system 400. Also, the opening 134 of the enclosure 102 is sealed by the support frame 436 such that the cooling fluid cannot enter the chamber 116 via the opening 134, despite conceivable incidental leakages of the dry cooling system 194.

Modifications and improvements to the above-described implementations of the present technology may become apparent to those skilled in the art. The foregoing description is intended to be exemplary rather than limiting. The scope of the present technology is therefore intended to be limited solely by the scope of the appended claims.

What is claimed is:

1. A heat extraction system for an enclosure receiving at least one computer having a computer fan, the heat extraction system comprising:
   at least one heat pipe having an evaporating reference temperature and a condensing reference temperature lower than the evaporating reference temperature, the at least one heat pipe being arranged with respect to the enclosure so as to transfer thermal energy from the enclosure to a surrounding environment of the enclosure when:
      an interior temperature of the enclosure is greater than the evaporating reference temperature, and
      an exterior temperature of the surrounding environment is less than the condensing reference temperature;
   an evaporator portion;
   a condenser portion;
   a support frame adapted for connection to the enclosure, the support frame being arranged with respect to the at least one heat pipe, such that, when the support frame is connected to the enclosure:
      the evaporator portion is thermally coupled to the at least one computer via convection, and
      the condenser portion is thermally coupled to the surrounding environment of the enclosure; and
   a control unit adapted for receiving a signal indicative of the interior temperature of the enclosure;
   wherein the control unit is adapted to be electronically connected to the computer fan for selectively causing the computer fan to direct at least a portion of a heated air flow away from the at least one computer.

2. The heat extraction system of claim 1, wherein:
   the control unit is adapted for receiving a signal indicative of the exterior temperature of the surrounding environment; and
   the heat extraction system further comprises an external fan electronically connected to the control unit and disposed proximate the condenser portion,
   the control unit causing the external fan to direct an external air flow toward the condenser portion when the exterior temperature of the surrounding environment is less than the condensing reference temperature and to direct the external air flow away from the condenser portion when the exterior temperature of the surrounding environment is less than the condensing reference temperature.

3. The heat extraction system of claim 1, wherein:
   the control unit is adapted for receiving a signal indicative of the exterior temperature of the surrounding environment;
   the heat extraction system further comprises an evaporative cooling system disposed proximate the condenser portion and electronically connected to the control unit, the control unit selectively causing the evaporative cooling system to cool the condenser portion when the exterior temperature of the surrounding environment reaches or exceeds a secondary cooling triggering temperature.

4. The heat extraction system of claim 3, wherein:
   the evaporative cooling system includes an external fan, the control unit causing the external fan to accelerate the velocity of air surrounding the condenser portion to cool the condenser portion.

5. The heat extraction system of claim 3, wherein:
the evaporative cooling system includes a sprayer, the control unit causing the sprayer to humidify air surrounding the condenser portion to cool the condenser portion.

6. The heat extraction system of claim 1, wherein:
the control unit is adapted for receiving a signal indicative of the exterior temperature of the surrounding environment; and
the heat extraction system further comprises a dry cooling system disposed proximate the condenser portion and electronically connected to the control unit, the control unit selectively causing the dry cooling system to cool the condenser portion when the exterior temperature of the surrounding environment reaches or exceeds a secondary cooling triggering temperature.

7. The heat extraction system of claim 1, further comprising:
an internal fan disposed proximate the evaporator portion and electronically connected to the control unit, the control unit selectively causing the internal fan to direct an internal air flow toward the evaporator portion when the interior temperature of the enclosure reaches or exceeds an internal fan triggering temperature.

8. The heat extraction system of claim 7, wherein:
the internal fan is arranged with respect to the at least one computer to aspire the heated air flow away from the at least one computer.

9. The heat extraction system of claim 7, wherein:
at least a portion of the heated air flow aspired by the internal fan is directed away from the at least one computer by the computer fan.

10. The heat extraction system of any one of claims 7 to 9, further comprising:
an external fan electronically connected to the control unit and disposed proximate the condenser portion;
the evaporator portion being thermally coupled to the at least one computer via convection;
the condenser portion being thermally coupled to a surrounding environment of the enclosure via convection;
the at least one heat pipe, the internal fan and the external fan being sized with respect to the at least one computer so as to fit inside a perimeter of the at least one computer; and
the at least one heat pipe being arranged with respect to the enclosure so as to transfer thermal energy from the enclosure to the surrounding environment when:
an interior temperature of the enclosure is greater than the evaporating reference temperature; and
an exterior temperature of the surrounding environment is less than the condensing reference temperature.

11. The heat extraction system of claim 10, wherein:
the at least one heat pipe is adapted for transferring thermal energy from inside of the enclosure to the surrounding environment at least at a target heat extraction rate when:
the control unit causes the internal fan to direct the internal air flow toward the evaporator portion; and
the control unit causes the external fan to direct an external air flow toward the condenser portion;
the at least one heat pipe transferring thermal energy at a rate being less than the target heat extraction rate in absence of at least one of the internal air flow and the external air flow.

12. The heat extraction system of claim 7, wherein the control unit is adapted for:
a) determining that the interior temperature of the enclosure is less than the evaporating reference temperature;
b) after a), causing the computer fan to stop or to reduce its speed;
c) after b), determining that the interior temperature of the enclosure is greater than the evaporating reference temperature; and
d) after c), causing the computer fan to start or to increase its speed.

13. The heat extraction system of claim 12, wherein the control unit is further adapted for:
causing the internal fan to stop when causing the computer fan to stop or reduce its speed; and
causing the internal fan to start when causing the computer fan to start or to increase its speed.

14. The heat extraction system of claim 1, wherein the at least one heat pipe is a 2-phase loop heat exchanger.

15. The heat extraction system of claim 1, wherein:
the support frame is adapted for connection to the enclosure via an opening of the enclosure; and
the support frame is arranged with respect to the opening so as to fluidly seal the enclosure from the surrounding environment when the support frame is connected to the enclosure.

16. The heat extraction system of claim 1, further comprising:
a stack disposed within the enclosure, the stack including a plurality of computer modules stacked on top of one another, each computer module including a respective support structure and a respective computer disposed in a respective housing;
wherein the evaporator portion is supported onto the stack.

17. A data center comprising the heat extraction system and the enclosure of claim 1.

* * * * *